United States Patent
Miura et al.

(10) Patent No.: US 11,177,790 B2
(45) Date of Patent: Nov. 16, 2021

(54) ACOUSTIC WAVE DEVICE, FILTER, AND MULTIPLEXER

(71) Applicant: TAIYO YUDEN CO., LTD., Tokyo (JP)

(72) Inventors: Shinpei Miura, Tokyo (JP); Satoshi Imasu, Tokyo (JP); Masafumi Iwaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/598,612

(22) Filed: Oct. 10, 2019

(65) Prior Publication Data

US 2020/0186123 A1     Jun. 11, 2020

(30) Foreign Application Priority Data

Dec. 10, 2018  (JP) .............................. JP2018-230909

(51) Int. Cl.
| | | |
|---|---|---|
| *H03H 9/145* | (2006.01) | |
| *H03H 9/25* | (2006.01) | |
| *H03H 9/64* | (2006.01) | |
| *H03H 9/02* | (2006.01) | |
| *H03H 9/72* | (2006.01) | |

(52) U.S. Cl.
CPC .... *H03H 9/14541* (2013.01); *H03H 9/02897* (2013.01); *H03H 9/02992* (2013.01); *H03H 9/25* (2013.01); *H03H 9/6483* (2013.01); *H03H 9/725* (2013.01)

(58) Field of Classification Search
CPC ......... H03H 9/25; H03H 9/145–14594; H03H 9/02–02992
See application file for complete search history.

(56) References Cited

U.S. PATENT DOCUMENTS

| | | | |
|---|---|---|---|
| 7,477,000 B2* | 1/2009 | Huang | H03H 9/02921 310/313 B |
| 8,134,278 B2* | 3/2012 | Cho | G01L 9/0025 310/313 D |
| 10,009,009 B2* | 6/2018 | Mimura | H03H 9/25 |
| 10,187,034 B2* | 1/2019 | Yoon | H01L 41/047 |
| 2008/0150390 A1* | 6/2008 | Hagelin | H02N 1/008 310/300 |
| 2016/0211829 A1 | 7/2016 | Iwaki et al. | 9/64 |

FOREIGN PATENT DOCUMENTS

JP        2016-136712 A     7/2016

* cited by examiner

*Primary Examiner* — Dean O Takaoka
*Assistant Examiner* — Alan Wong
(74) *Attorney, Agent, or Firm* — Stein IP, LLC

(57) ABSTRACT

An acoustic wave device includes: a piezoelectric substrate; and a pair of comb-shaped electrodes located on the piezoelectric substrate, each of the comb-shaped electrodes including a plurality of electrode fingers, side surfaces facing each other of the electrode fingers having a plurality of protrusion portions and a plurality of recessed portions arranged in an extension direction of the electrode fingers, ends of the protrusion portions and the recessed portions narrowing.

17 Claims, 12 Drawing Sheets

ACOUSTIC WAVE DEVICE, FILTER, AND MULTIPLEXER

CROSS-REFERENCE TO RELATED APPLICATION

This application is based upon and claims the benefit of priority of the prior Japanese Patent Application No. 2018-230909, filed on Dec. 10, 2018, the entire contents of which are incorporated herein by reference.

FIELD

A certain aspect of the present invention relates to an acoustic wave device, a filter, and a multiplexer.

BACKGROUND

In high frequency communication systems typified by mobile phones, high-frequency filters have been used to remove unnecessary signals other than signals in the frequency band used for communication. Acoustic wave devices including surface acoustic wave (SAW) elements are used in the high-frequency filters. The SAW element is an element in which an interdigital transducer (IDT) including a pair of comb-shaped electrodes is formed on a piezoelectric substrate as disclosed in, for example, Japanese Patent Application Publication No. 2016-136712 (hereinafter, referred to as Patent Document 1).

SUMMARY OF THE INVENTION

According to a first aspect of the present invention, there is provided an acoustic wave device including: a piezoelectric substrate; and a pair of comb-shaped electrodes located on the piezoelectric substrate, each of the comb-shaped electrodes including a plurality of electrode fingers, side surfaces facing each other of the electrode fingers having a plurality of protrusion portions and a plurality of recessed portions arranged in an extension direction of the electrode fingers, ends of the protrusion portions and the recessed portions narrowing.

According to a second aspect of the present invention, there is provided a filter including the above acoustic wave device.

According to a third aspect of the present invention, there is provided a multiplexer including the above filter.

DETAILED DESCRIPTION

The acoustic wave device is desired to be reduced in size.

Hereinafter, with reference to the drawings, embodiments of the present disclosure will be described.

First Embodiment

Figure 1A:
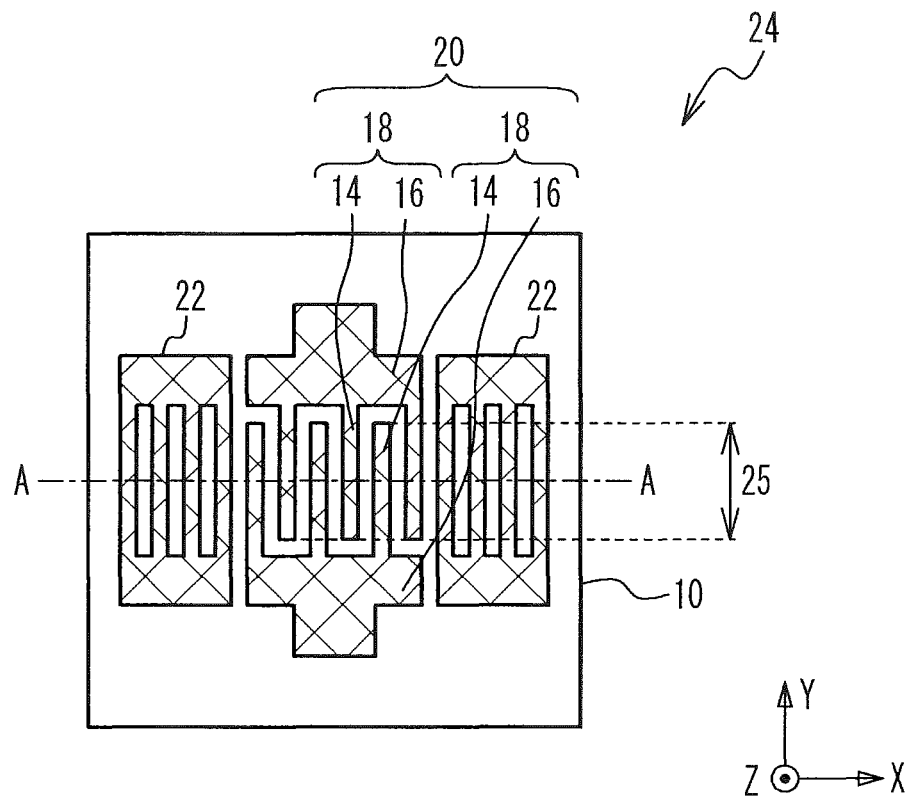
FIG. 1A is a plan view of an acoustic wave resonator in a first embodiment.
Figure 1B:
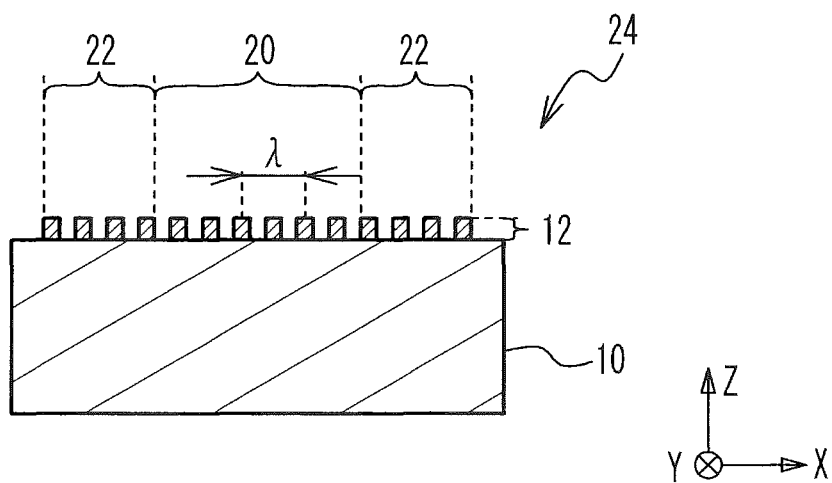
FIG. 1B is a cross-sectional view taken along line A-A in FIG. 1A.

An acoustic wave resonator will be described as an example of an acoustic wave device. FIG. 1A is a plan view of an acoustic wave resonator in a first embodiment, and FIG. 1B is a cross-sectional view taken along line A-A in FIG. 1A. The direction in which electrode fingers are arranged (the arrangement direction of the electrode fingers) is defined as an X direction, the direction in which the electrode fingers extend (the extension direction of the electrode fingers) is defined as a Y direction, and the direction normal to the piezoelectric substrate (the normal direction of the piezoelectric substrate) is defined as a Z direction. The X, Y, and Z directions do not necessarily correspond to the crystal orientations of a piezoelectric substrate 10.

As illustrated in FIG. 1A and FIG. 1B, an acoustic wave resonator 24 includes an IDT 20 and reflectors 22. The IDT 20 and the reflectors 22 are located on a piezoelectric substrate 10. The piezoelectric substrate 10 is, for example, a lithium tantalate substrate, a lithium niobate substrate, or a crystal substrate. When the piezoelectric substrate 10 is a rotated Y-cut X-propagation lithium tantalate substrate or a rotated Y-cut X-propagation lithium niobate substrate, the X direction corresponds to the X-axis orientation of the crystal orientation of the piezoelectric substrate 10. The IDT 20 and the reflectors 22 are formed of a metal film 12. The metal film 12 is mainly composed of at least one of, for example, aluminum (Al), copper (Cu), molybdenum (Mo), iridium (Ir), platinum (Pt), rhenium (Re), rhodium (Rh), ruthenium (Ru), tantalum (Ta) and tungsten (W).

The IDT 20 includes a pair of comb-shaped electrodes 18. Each of the comb-shaped electrodes 18 includes a plurality of electrode fingers 14 and a bus bar 16 to which the electrode fingers 14 are coupled. The electrode fingers 14 of one of the comb-shaped electrodes 18 and the electrode fingers 14 of the other of the comb-shaped electrodes 18 are alternately arranged in at least a part of the IDT 20. The region where the electrode fingers 14 of one of the comb-shaped electrodes 18 face the electrode fingers 14 of the other of the comb-shaped electrodes 18 in the X direction is an overlap region 25. The reflectors 22 are formed at both sides of the IDT 20 in the X direction. The reflectors 22 reflect an acoustic wave. The pitch of the electrode fingers 14 of one of the comb-shaped electrodes 18 is represented by λ. λ corresponds to the wavelength of the surface acoustic wave excited by the IDT 20.

The piezoelectric substrate 10 may be bonded on a support substrate such as, but not limited to, a silicon substrate, a sapphire substrate, an alumina substrate, a spinel substrate, a glass substrate, or a crystal substrate. An insulating film such as, but not limited to, a silicon oxide film or an aluminum nitride film may be located between the support substrate and the piezoelectric substrate 10. An insulating film such as, but not limited to, a silicon oxide film or a silicon nitride film may be provided so as to cover the metal film 12. The film thickness of the insulating film may be greater than the film thickness of the metal film 12, or may be less than the film thickness of the metal film 12.

Figure 2:
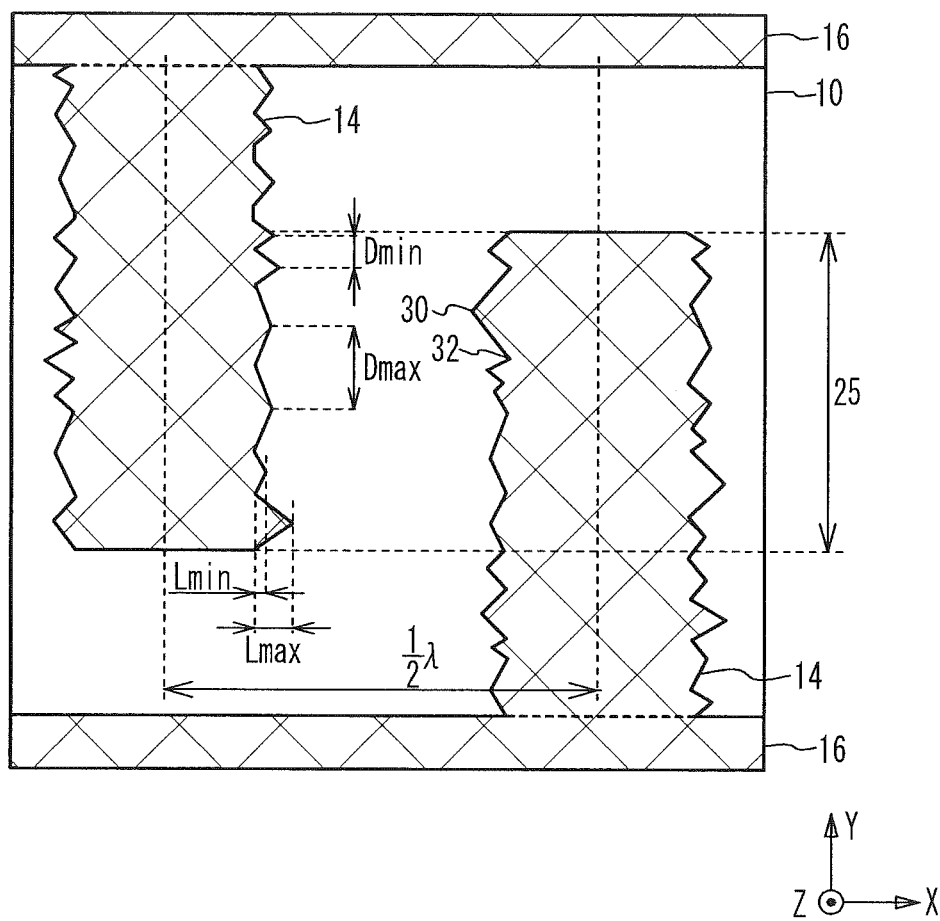
FIG. 2 is an enlarged plan view of the acoustic wave resonator in the first embodiment.

FIG. 2 is an enlarged plan view of the acoustic wave resonator in the first embodiment. Some of the electrode fingers in the overlap region are illustrated. As illustrated in FIG. 2, the side surfaces of the electrode finger 14 in the X direction in the overlap region 25 have protrusion portions 30 and recessed portions 32 in the Y direction. The protrusion portions 30 are located at random intervals in the Y direction. The distances between the protrusion portions 30 and the recessed portions 32 next to each other in the X direction are random. The side surface in the Y direction of the electrode finger 14 and the side surface in the Y direction of the bus bar 16 are substantially flat in the X direction. In FIG. 2, the outer peripheries of the protrusion portions 30 and the recessed portions 32 are illustrated by straight lines, but the outer peripheries of the protrusion portions 30 and the recessed portions 32 may be curved.

The pitch of the electrode fingers 14 (the distance between the centers of the electrode fingers 14) is λ/2. The minimum interval between the adjacent protrusion portions 30 in the Y direction (i.e., the interval between the protrusion portions 30 located adjacent to each other at the narrowest interval among the protrusion portions 30) is represented by D min, and the maximum interval between the adjacent protrusion portions 30 in the Y direction (i.e., the interval between the protrusion portions 30 located adjacent to each other at the widest interval among the protrusion portions 30) is represented by D max. The sum of D min and D max is represented by 2D (2D=D max+D min). The minimum distance in the X direction between the protrusion portion 30 and the recessed portion 32 located next to each other (i.e., the distance between the top of the first protrusion portion 30 and the bottom of the first recessed portion 32, wherein the first protrusion portion 30 and the first recessed portion 32 are located next to each other, and the distance in the X direction between the top of the first protrusion portion 30 and the bottom of the first recessed portion 32 is smallest among the distances in the X direction between the protrusion portions 30 and the recessed portions 32 located next to each other) is represented by L min. The maximum distance in the X direction between the protrusion portion 30 and the recessed portion 32 located next to each other (i.e., the distance between the top of the second protrusion portion 30 and the bottom of the second recessed portion 32, wherein the second protrusion portion 30 and the second recessed portion 32 are located next to each other, and the distance in the X direction between the top of the second protrusion portion 30 and the bottom of the second recessed portion 32 is largest among the distances in the X direction between the protrusion portions 30 and the recessed portions 32 located next to each other) is represented by L max. The sum of L min and L max is represented by 2L (2L=L max+L min).

Here, when D min, D max, L min, and L max of 10 (more preferably 20, further preferably, 50) protrusion portions 30 continuously located in the Y direction and 10 recessed portions 32 continuously located in the Y direction are observed through a microscope, and 2D and 2L are calculated, the calculated 2D and 2L do not greatly differ from 2D and 2L calculated for one electrode finger 14. Thus, it is sufficient if D min, D max, L min, and L max are measured for 10 protrusion portions 30 continuously located in the Y direction and 10 recessed portions 32 continuously located in the Y direction to calculate 2D and 2L.

Figure 3A:
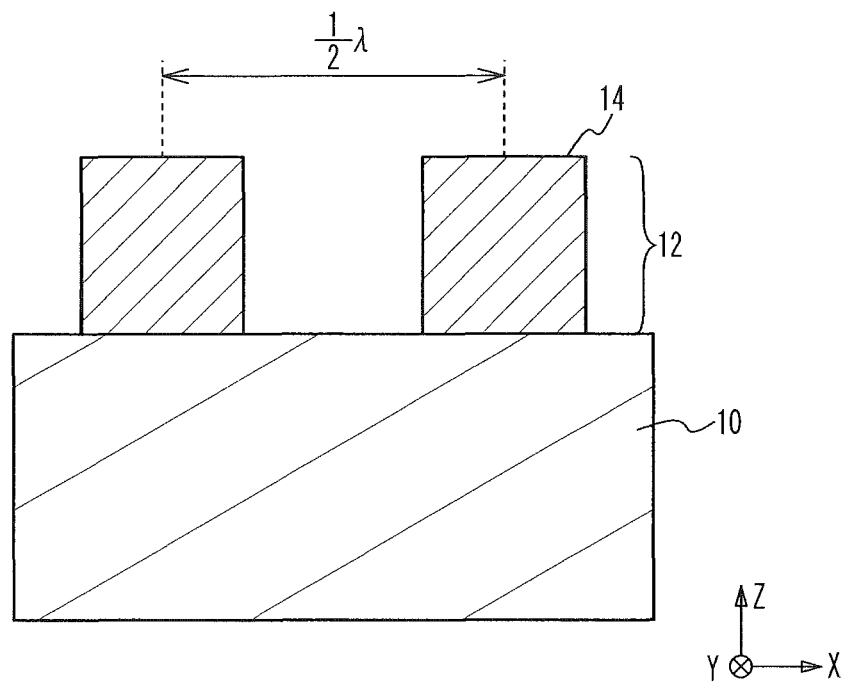
FIG. 3A and FIG. 3B are enlarged cross-sectional views of the acoustic wave resonator in the first embodiment.
Figure 3B:
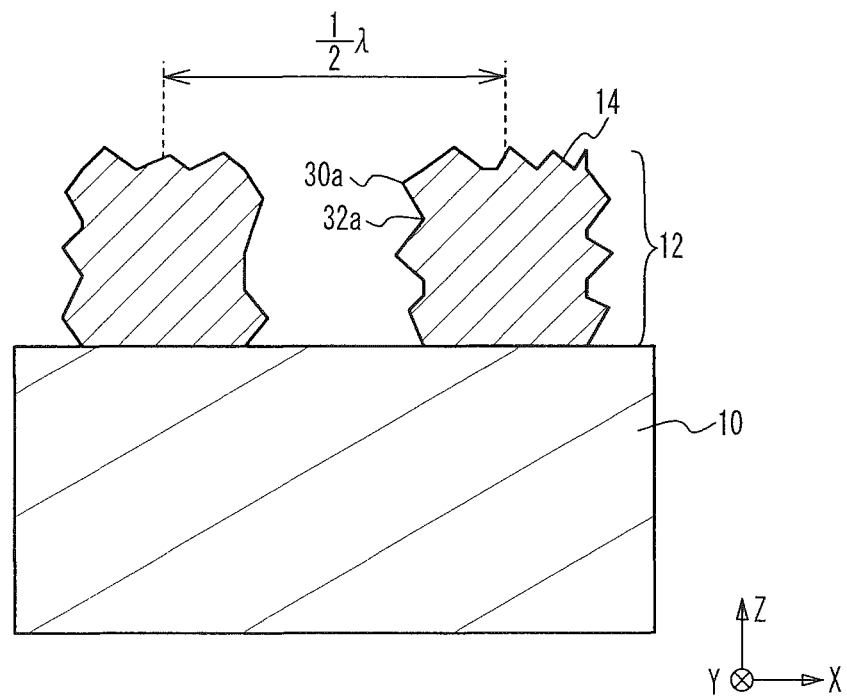

FIG. 3A and FIG. 3B are enlarged cross-sectional views of the acoustic wave resonator in the first embodiment. As illustrated in FIG. 3A, the side surfaces in the X direction of the electrode finger 14 are substantially flat in the Z direction. As illustrated in FIG. 3B, the side surfaces in the X direction of the electrode finger 14 have protrusion portions 30a and recessed portions 32a in the Z direction. In this case, when the electrode finger 14 is observed from the Z direction through an optical microscope or an electron microscope, the position at which the microscope comes into focus in the Z direction is located in the same XY plane. It is sufficient if D min, D max, L min, and L max are measured in the position at which the microscope comes into focus in the Z direction. As illustrated in FIG. 3A, the side surfaces of the electrode finger 14 may be substantially flat in the Z direction (for example, the degree of unevenness in the X direction is equal to or less than one-tenth of the degree of unevenness in the Y direction formed by the protrusion portions 30 and the recessed portions 32). As illustrated in FIG. 3B, the side surfaces of the electrode finger 14 may have the protrusion portions 30a and the recessed portions 32a in the Z direction.

The electrostatic capacitance between a pair of the electrode fingers 14 facing each other was calculated under the assumption that the side surfaces of the electrode finger 14 were flat in the Z direction as illustrated in FIG. 3A. It was assumed that D min=D max=D and L min=L max=L. It was assumed that the outer peripheries of the protrusion portions 30 and the recessed portions 32 were linear. It was assumed that D=λ/20. The electrostatic capacitance between the electrode fingers 14 in each of the cases of L=0, L=0.01λ, and L=0.02λ was calculated. Based on the calculated electrostatic capacitance, the area of the acoustic wave resonator 24 having the same electrostatic capacitance as the calculated electrostatic capacitance was calculated. The dimensions used to calculate the area of the acoustic wave resonator 24 are as follows. In the IDT 20, it was assumed that the pitch A was 4 μm, the number of pairs of the electrode fingers 14 was 50 pairs, the aperture length (the length of the overlap region 25 in the Y direction) was 20λ, and the duty ratio of the electrode finger 14 was 50%. In the reflector 22, it was assumed that the number of pairs was 10 pairs, and the aperture length and the duty ratio were the same as those of the IDT 20.

Table 1 lists the electrostatic capacitance, the size of the resonator, and the decrease ratio of the size of the resonator. "Electrostatic capacitance" is normalized such that the electrostatic capacitance of the acoustic wave resonator with L=0 is 1. "Resonator size" indicates the area of the acoustic wave resonator having the same electrostatic capacitance as the acoustic wave resonator with L=0, and is normalized such that the size of the acoustic wave resonator with L=0 is 1. "Decrease ratio of the resonator size" indicates the decrease ratio of the size of the acoustic wave resonator from the size of the acoustic wave resonator with L=0 by %.

TABLE 1

| L | Electrostatic capacitance | Resonator size | Decrease ratio of the resonator size |
|---|---|---|---|
| 0 | 1.0000 | 1.0000 | 0% |
| 0.01λ | 1.0072 | 0.9928 | 0.72% |
| 0.02λ | 1.0145 | 0.9857 | 1.43% |

As presented in Table 1, when L is 0.01λ, the electrostatic capacitance is 1.0072 times the electrostatic capacitance of the acoustic wave resonator with L=0. When the acoustic wave resonator having the same electrostatic capacitance as the acoustic wave resonator with L=0 is fabricated, the size of the acoustic wave resonator is smaller than the size of the acoustic wave resonator with L=0 by 0.72%. When L is 0.02λ, the electrostatic capacitance is 1.0145 times the electrostatic capacitance of the acoustic wave resonator with L=0. When the resonator having the same electrostatic capacitance as the acoustic wave resonator with L=0 is fabricated, the size of the acoustic wave resonator is smaller than the acoustic wave resonator with L=0 by 1.43%.

In the first embodiment, the side surfaces facing each other of the electrode fingers 14 of a pair of the comb-shaped electrodes 18 in the overlap region 25 have a plurality of the protrusion portions 30 and a plurality of the recessed portions 32 arranged in the Y direction (the extension direction). Ends of the protrusion portions 30 and the recessed portions 32 narrow. This structure increases the electrostatic capacitance between the electrode fingers 14 (i.e., the electrostatic capacitance between a pair of the comb-shaped electrodes 18). When the acoustic wave resonators 24 are designed to have the same electrostatic capacitance (i.e., impedance), the acoustic wave resonator 24 having a larger electrostatic capacitance between the electrode fingers 14 has a smaller size. Thus, the acoustic wave resonator 24 can be reduced in size.

Large 2D (=D max+D min) affects the characteristics of the acoustic wave resonator 24. When D is equal to or less than λ/8, the unevenness of the side surfaces of the electrode fingers 14 hardly affects the characteristics of the acoustic wave resonator 24. Thus, 2D is preferably equal to or less than one-sixteenth (1/16) of λ (the pitch of the electrode fingers of one of the pair of comb-shaped electrodes), more preferably equal to or less than one thirty-second (1/32) of λ. When D is too small, the electrostatic capacitance between the electrode fingers 14 is difficult to increase. Thus, 2D is preferably equal to or greater than one thousandth (1/1000) of λ, more preferably equal to or greater than one two-hundredth (1/200) of λ, further preferably equal to or greater than one-hundredth (1/100) of λ.

Large 2L (=L max+L min) affects the characteristics of the acoustic wave resonator 24. When L is equal to or less than λ/8, the unevenness of the side surfaces of the electrode fingers 14 hardly affects the characteristics of the acoustic wave resonator 24. Thus, 2L is preferably equal to or less than one-sixteenth (1/16) of λ, more preferably equal to or less than one thirty-second (1/32) of λ, further preferably equal to or less than one-hundredth (1/100) of λ. When L is too small, the electrostatic capacitance between the electrode fingers 14 is difficult to increase. Thus, 2L is preferably equal to or greater than one thousandth (1/1000) of λ, more preferably equal to or greater than one two-hundredth (1/200) of λ, further preferably equal to or greater than one-hundredth (1/100) of λ.

When the protrusion portions 30 and the recessed portions 32 are regularly arranged in the Y direction, unnecessary response may be generated. Thus, the protrusion portions 30 and the recessed portions 32 are preferably provided in the Y direction randomly (i.e., irregularly).

First Variation of the First Embodiment

Figure 4:
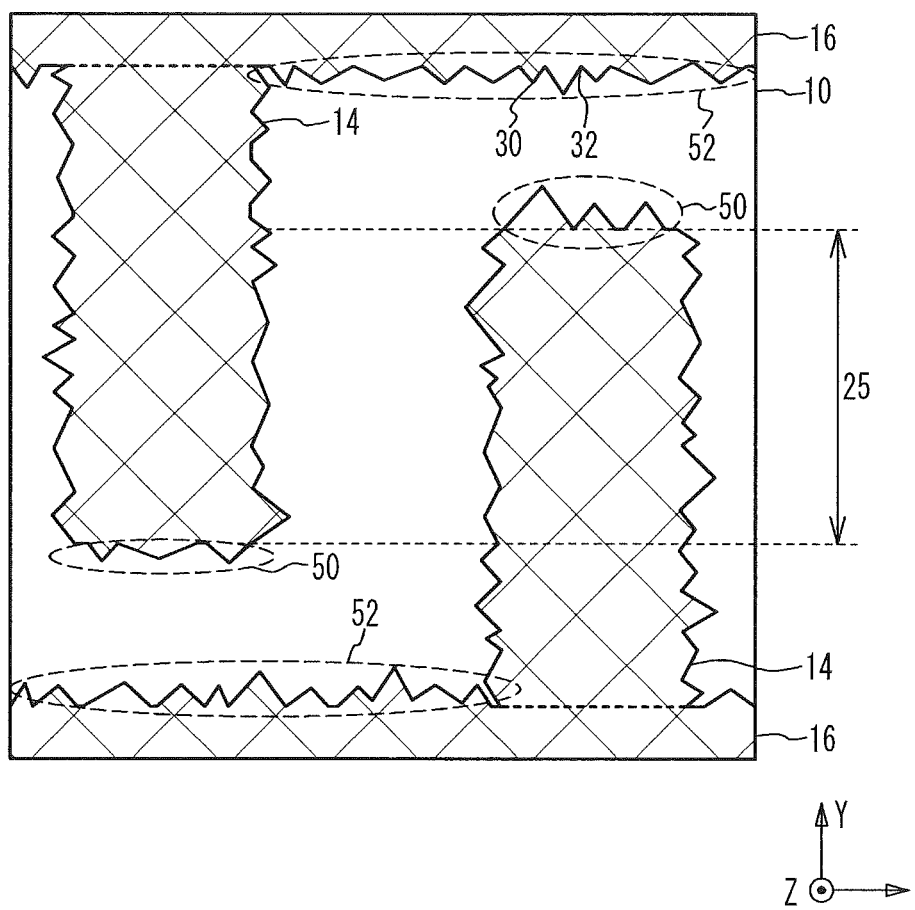
FIG. 4 is an enlarged plan view of an acoustic wave resonator in a first variation of the first embodiment.

FIG. 4 is an enlarged plan view of an acoustic wave resonator in a first variation of the first embodiment. As illustrated in FIG. 4, the protrusion portions 30 and the recessed portions 32 are located on a side surface 50 in the Y direction of the electrode finger 14. The protrusion portions 30 and the recessed portions 32 are located on a side surface 52 in the Y direction of the bus bar 16. Other structures are the same as those of the first embodiment, and the description thereof is thus omitted.

In the first variation of the first embodiment, the side surfaces 50 of the end of the electrode fingers 14 and the side surface 52, facing the side surface 50, of the bus bar 16 have the protrusion portions 30 and the recessed portions 32 arranged in the X direction. This structure increases the electrostatic capacitance between the electrode finger 14 and the bus bar 16. Thus, the acoustic wave resonator 24 is further reduced in size.

Second Variation of the First Embodiment

Figure 5:
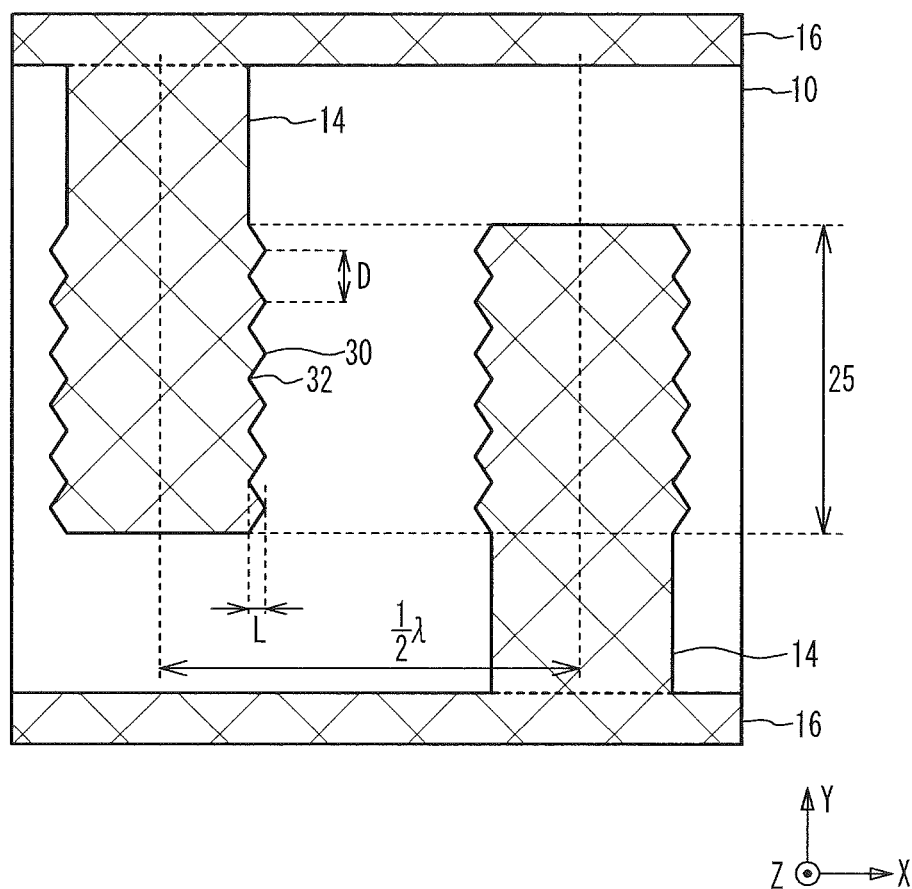
FIG. 5 is an enlarged plan view of an acoustic wave resonator in accordance with a second variation of the first embodiment.

FIG. 5 is an enlarged plan view of an acoustic wave resonator in a second variation of the first embodiment. As illustrated in FIG. 5, no protrusion portion 30 and no recessed portion 32 are provided on the surfaces other than side surfaces facing each other of the electrode fingers 14 within the overlap region 25. The side surface of the electrode finger 14 has the protrusion portions 30 and the recessed portions 32 arranged regularly in the Y direction. Other structures are the same as those of the first embodiment, and the description thereof is thus omitted.

As in the second variation of the first embodiment, the side surfaces other than the side surfaces of the electrode fingers 14 in the overlap region 25 of the comb-shaped electrodes 18 may be flat. The protrusion portions 30 and the recessed portions 32 may be regularly provided.

Second Embodiment

Figure 6:
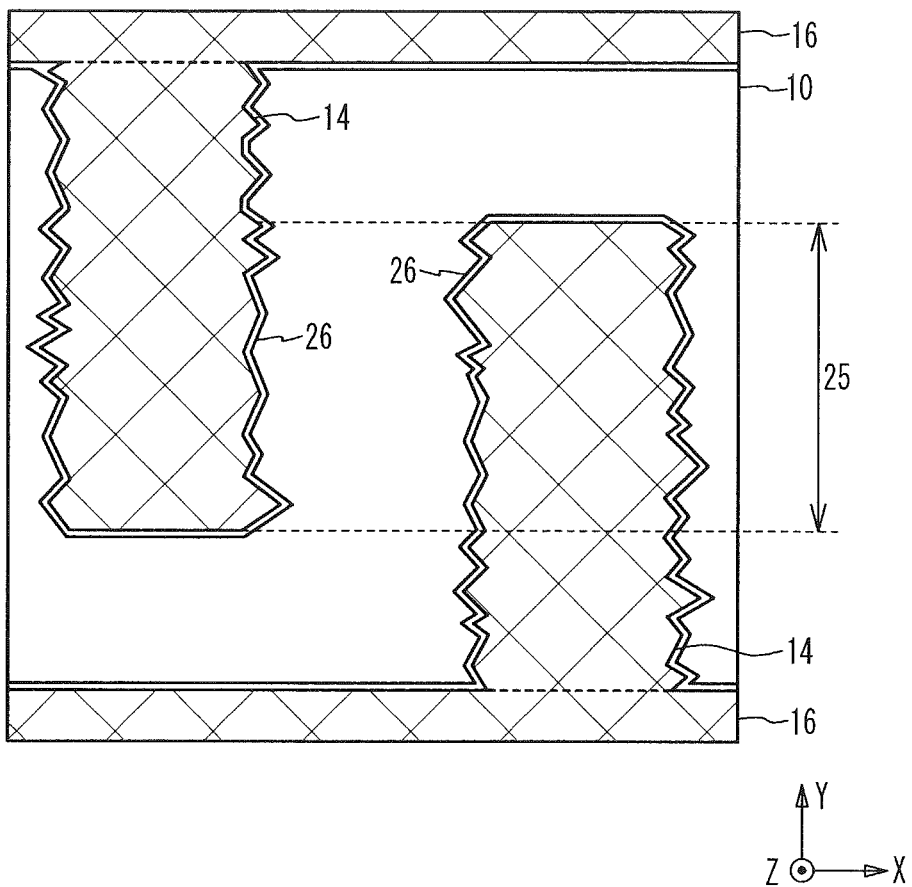
FIG. 6 is an enlarged plan view of an acoustic wave resonator in accordance with a second embodiment.
Figure 7A:
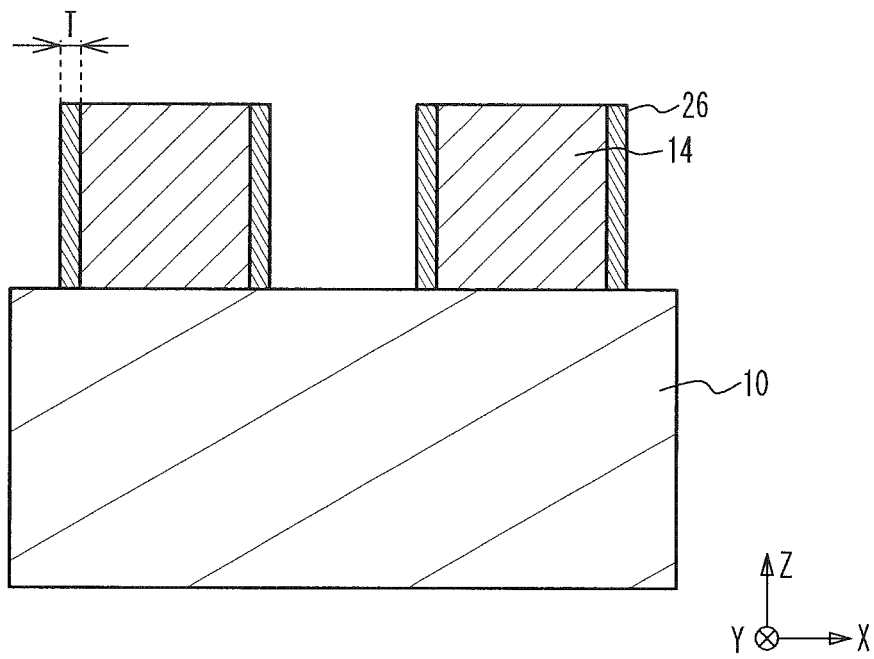
FIG. 7A and FIG. 7B are enlarged cross-sectional views of the acoustic wave resonator in the second embodiment.
Figure 7B:
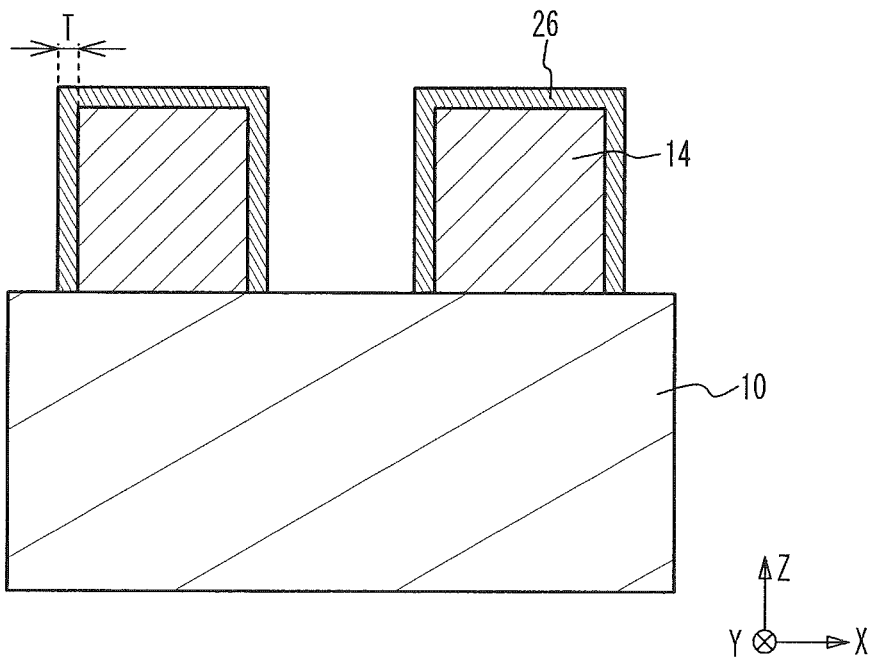

FIG. 6 is an enlarged plan view of an acoustic wave resonator in a second embodiment. As illustrated in FIG. 6, an insulating film 26 is located on the side surfaces of the electrode fingers 14. FIG. 7A and FIG. 7B are enlarged cross-sectional views of the acoustic wave resonator in the second embodiment. As illustrated in FIG. 7A, the insulating film 26 is located on the side surfaces in the X direction of the electrode fingers 14, and is not located on the upper surfaces of the electrode fingers 14. As illustrated in FIG. 7B, the insulating film 26 is located on the side surfaces and the upper surface of the electrode finger 14. The insulating film 26 may be located on the upper surface of the electrode finger 14, or may not be necessarily provided on the upper surface of the electrode finger 14. The insulating film 26 is made of an oxide of the metal film 12 forming the electrode finger 14. The insulating film 26 has a thickness of T.

Manufacturing Method of the Second Embodiment

Figure 8A:
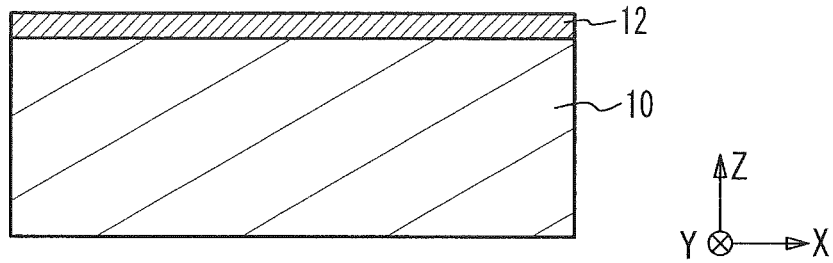
FIG. 8A through FIG. 8D are cross-sectional views (No. 1) illustrating a method of manufacturing the acoustic wave resonator in the second embodiment.
Figure 8B:
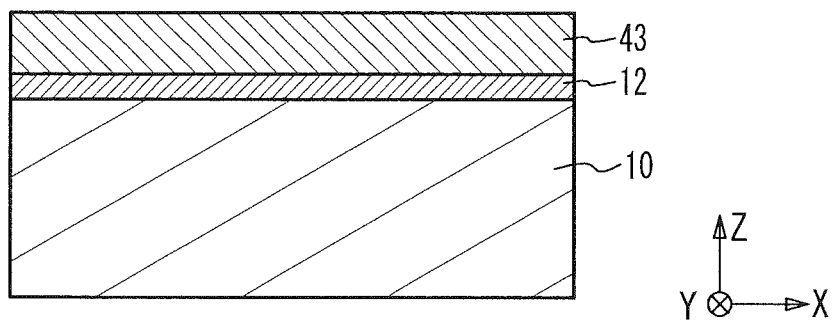

FIG. 8A through FIG. 9C are cross-sectional views illustrating a method of manufacturing the acoustic wave resonator in the second embodiment. As illustrated in FIG. 8A, the metal film 12 is formed on the piezoelectric substrate 10 by vacuum evaporation, ion assisted evaporation, or sputtering. As illustrated in FIG. 8B, photoresist 43 is applied onto the metal film 12. Thereafter, baking is performed. The photoresist 43 is, for example, positive photoresist.

Figure 8C:
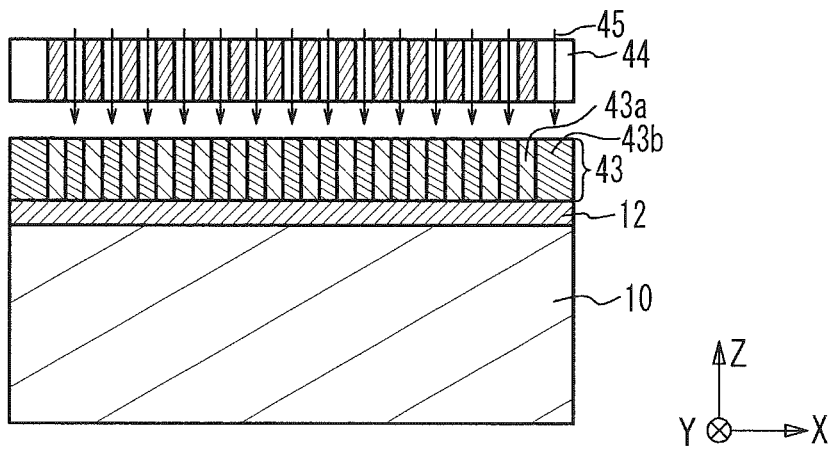
Figure 8D:
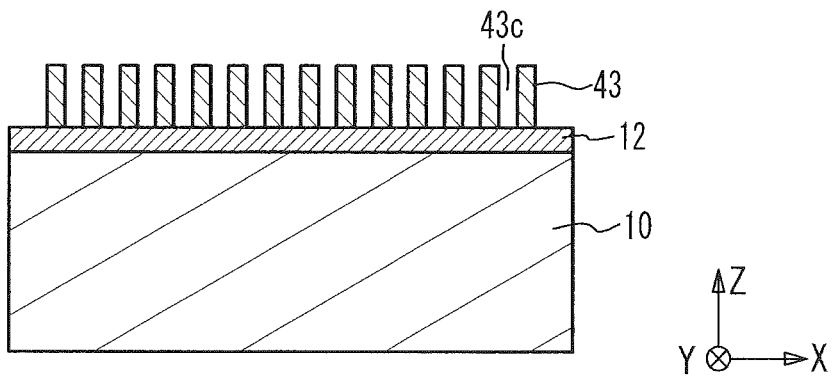

As illustrated in FIG. 8C, the photoresist 43 is irradiated with an exposing light 45 through a photomask 44. Regions 43a not irradiated with the exposing light 45 in the photoresist 43 are not exposed, and regions 43b irradiated with the exposing light 45 in the photoresist 43 are exposed. Patterns to be the protrusion portions 30 and the recessed portions 32 are provided to the pattern of the photomask 44 used to form the comb-shaped electrodes 18. As illustrated in FIG. 8D, the development of the photoresist 43 removes the regions 43b, and apertures 43c are thereby formed.

Figure 9A:
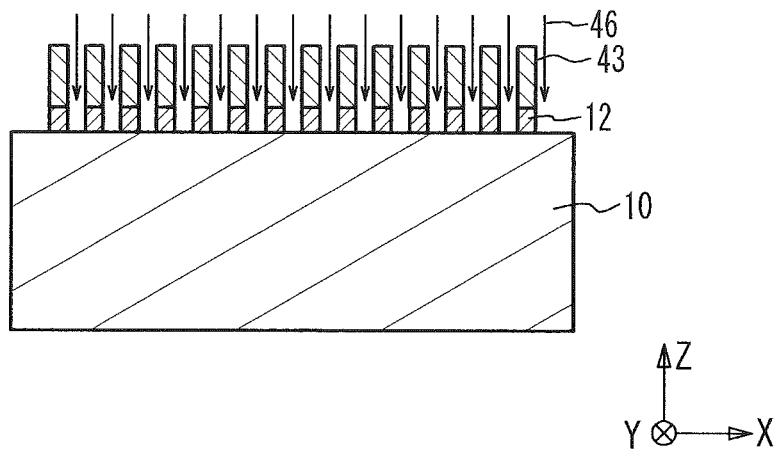
FIG. 9A through FIG. 9C are cross-sectional views (No. 2) illustrating a method of manufacturing the acoustic wave resonator in the second embodiment.
Figure 9B:
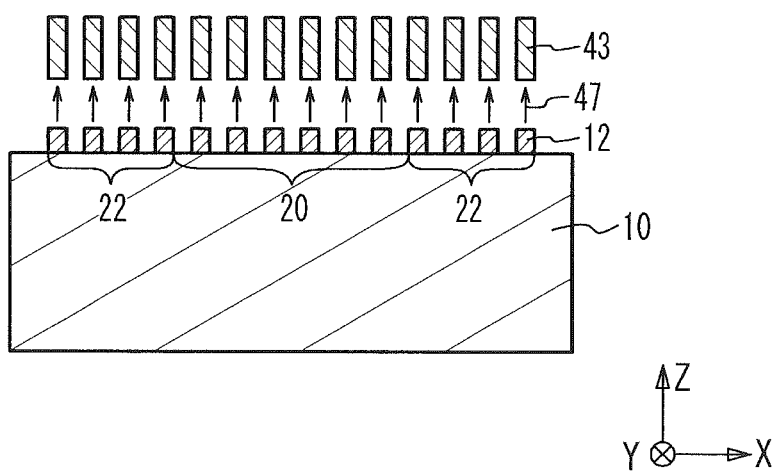

As illustrated in FIG. 9A, the metal film 12 is wet-etched or dry-etched using the photoresist 43 as a mask as indicated by arrows 46. The metal film 12 is patterned through this process. As illustrated in FIG. 9B, the photoresist 43 is removed as indicated by arrows 47. This process forms the IDT 20 and the reflectors 22 from the metal film 12. Thus, the acoustic wave resonators of the first embodiment and the variations thereof are formed.

Figure 9C:
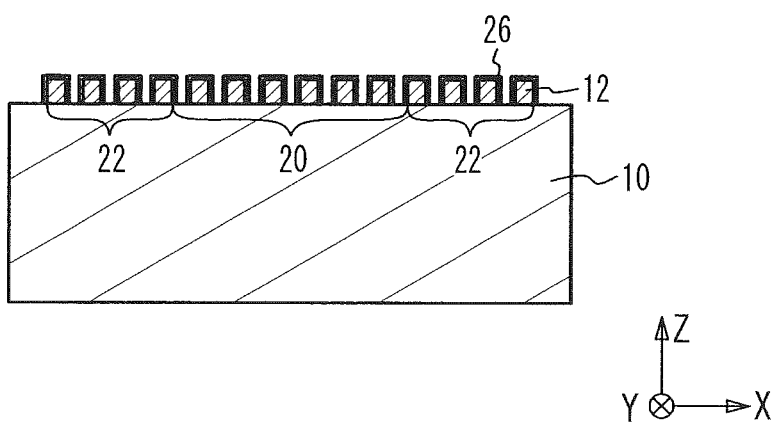

As illustrated in FIG. 9C, the surface of the metal film 12 is oxidized to form the insulating film 26. The insulating film 26 is formed by, for example, heat treatment in oxygen atmosphere. When the metal film 12 is a molybdenum film, the heat treatment of the metal film 12 is conducted at a temperature of 200° C. in air atmosphere for 30 minutes, for example. This process oxidizes the surface of the metal film 12, and thereby, the insulating film 26 formed of molybdenum oxide with a thickness of 10 nm to 20 nm is formed. The insulating film 26 may be formed by exposing the surface of the metal film 12 to oxygen plasma.

An example in which the patterns to be the protrusion portions 30 and the recessed portions 32 are provided to the photomask 44 has been described, but the protrusion portions 30 and the recessed portions 32 may be formed by appropriately setting the etching conditions in FIG. 9A. A step of making the side surfaces of the electrode fingers 14 uneven may be provided between the step of FIG. 9A and the step of FIG. 9C. One example of the step of making the side surfaces of the electrode fingers 14 uneven is a step of irradiating the side surfaces of the electrode fingers 14 with ions or plasma.

When a large electric power is applied to the IDT 20, vibration and/or stress is applied to the electrode fingers 14. In the case where the protrusion portions 30 and the recessed portions 32 are located on the side surfaces of the electrode fingers 14 as in the first embodiment and the variations thereof, when vibration and/or stress is applied to the electrode fingers 14, the electrode finger 14 may break starting from the protrusion portion 30 and the recessed portion 32.

In the second embodiment, the insulating film 26 is provided so as to cover the side surfaces of the electrode fingers 14. This structure allows the insulating film 26 to inhibit the breakage of the electrode finger 14 even when vibration and/or stress is applied to the electrode fingers 14. The insulating film 26 is mainly composed of an oxide of the metal element that is the main component of the electrode fingers 14. As described above, when the insulating film 26 is made of an oxide of the electrode finger 14, the insulating film 26 is in close contact with the electrode finger 14. Furthermore, when the insulating film 26 is formed by oxidizing the metal film 12 as illustrated in FIG. 9C, the adhesiveness between the metal film 12 and the insulating film 26 is increased. Thus, even when vibration and/or stress is applied to the electrode fingers 14, the insulating film 26 further inhibits the breakage of the electrode finger 14.

The metal element that is the main component of the electrode finger 14 is a component excluding intentionally added impurities and unintended impurities, and is the metal element contained in the electrode finger 14 in 50 atomic % or greater (or 80 atomic % or greater). The oxide of the metal element, which is the main component of the insulating film 26, is a component excluding intentionally added impurities and unintended impurities. The insulating film 26 is mainly composed of an oxide of the metal element that is the main component of the electrode finger 14" means that the insulating film 26 contains 50 atomic % or greater (or 80 atomic % or greater) of the metal element that is the main component of the electrode finger 14.

When the insulating film 26 is thick, the effect achieved by providing the protrusion portions 30 and the recessed portions 32 on the side surfaces of the electrode fingers 14 to increase the electrostatic capacitance between the electrode fingers 14 decreases. Thus, the thickness T of the insulating film 26 is preferably equal to less than 1 time 2L, more preferably equal to or less than one-half ($\frac{1}{2}$) of 2L, and further preferably equal to or less than one-quarter ($\frac{1}{4}$) of 2L. When the insulating film 26 is thin, the effect of inhibiting the breakage of the electrode finger 14 is reduced. Thus, the thickness T of the insulating film 26 is equal to or greater than one-hundredth ($\frac{1}{100}$) of 2L, more preferably equal to or greater than one-fiftieth ($\frac{1}{50}$) of 2L, further preferably equal to or greater than one-twentieth ($\frac{1}{20}$) of 2L.

First Variation of the Second Embodiment

Figure 10:
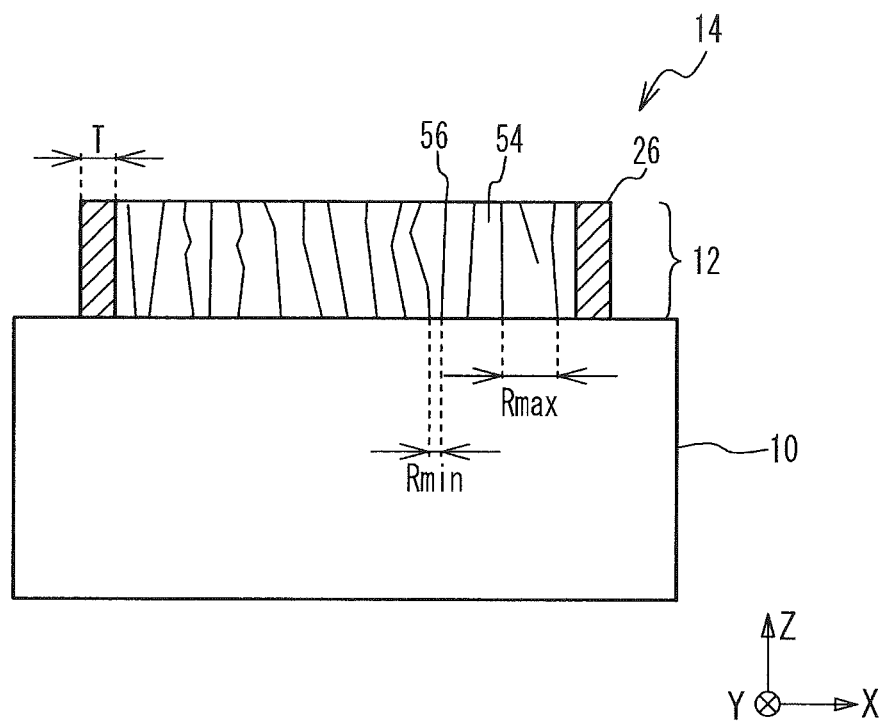
FIG. 10 is an enlarged cross-sectional view of an acoustic wave resonator in a first variation of the second embodiment.

FIG. 10 is an enlarged cross-sectional views of an acoustic wave resonator in accordance with a first variation of the second embodiment. As illustrated in FIG. 10, in the metal film 12, crystal grains 54 have columnar shapes extending in the Z direction, and grain boundaries 56 extend in the Z direction. The width of the crystal grain 54 having the largest width in the X direction is represented by Rmax, and the width of the crystal grain 54 having the smallest width in the X direction is represented by Rmin. The sum of Rmin and Rmax is represented by 2R=Rmax+Rmin. R is, for example, 10 nm to 100 nm. When the metal film 12 is made of molybdenum, R is 40 nm to 50 nm.

When Rmin and Rmax of 10 (more preferably 20, further preferably 50) crystal grains 54 continuously located in the X direction and/or the Y direction are observed by TEM, and 2R is calculated, the calculated 2R does not greatly differ from 2R calculated for one electrode finger 14. Thus, it is sufficient if Rmin and Rmax of 10 crystal grains 54 continuously located in the X direction and/or the Y direction are measured to calculate 2R.

In the columnar structure, the grain boundary 56 is clear. This is because the bond between the crystal grains 54 is weak and/or there is a gap between the crystal grains 54. The sizes of the crystal grains 54 are substantially uniform, and the crystal grains 54 are continuously located in the Z direction. Thus, when a large electric power is applied to the IDT 20, the metal film 12 is likely to be broken starting from the grain boundary 56 positioned in the protrusion portion 30 and the recessed portion 32.

For the insulating film 26 to inhibit the breakage of the metal film 12 starting from the grain boundary 56, the thickness T of the insulating film 26 is preferably equal to or greater than one-eighth ($\frac{1}{8}$) of 2R, more preferably equal to or greater than one-quarter ($\frac{1}{4}$) of 2R. Even when the thickness T of the insulating film 26 is greater than R, the effect of inhibiting the breakage of the metal film 12 starting from the grain boundary 56 is not enhanced so much. Thus, the thickness T of the insulating film 26 is preferably equal to or less than 1 time 2R, more preferably equal to or less than one-half (½) of 2R.

It is difficult to configure D and L in the protrusion portions 30 and the recessed portions 32 on the side surface of the electrode finger 14 to be equal to or less than R. Thus, D is preferably greater than R, more preferably equal to or greater than 2 times R, further preferably equal to or greater than 3 times R. L is preferably greater than R, more preferably equal to or greater than two times R, further preferably equal to or greater than three times R.

When the acoustic velocity of the surface acoustic wave excited by the IDT 20 is greater than the acoustic velocity of a bulk wave (for example, the slowest lateral bulk wave) propagating through the piezoelectric substrate 10, the surface acoustic wave propagates through the surface of the piezoelectric substrate 10 while emitting a bulk wave. Thus, loss occurs. In particular, the acoustic velocity of a shear horizontal (SH) wave, which is a type of surface acoustic wave, is greater than the acoustic velocity of the bulk wave. Thus, in the acoustic wave resonator in which the SH wave is the primary mode, the loss is large. For example, in the case of a Y-cut X-propagation lithium tantalate substrate having a cut angle of 20° or greater and 48° or less, the SH wave is the primary mode.

To reduce the acoustic velocity of the surface acoustic wave, a metal with large acoustic impedance is used for the metal film 12. The acoustic impedance Z increases as the density and Young's modulus increase. A metal with a higher atomic number has a larger density, and a harder metal has larger Young's modulus. Such metals are high melting point metals of which the melting point is high. As described above, when the high melting point metal is used for the metal film 12, the acoustic velocity of the surface acoustic wave decreases, and the loss decreases. In addition, when the acoustic velocity of the surface acoustic wave decreases, the pitch of the electrode fingers 14 decreases. Thus, the acoustic wave resonator is reduced in size.

Since the high melting point metal has a large number of electrons and a small atomic radius, its metallic bonding is strong. The electromigration is a phenomenon that metal atoms migrate due to the electric field, and the stress migration is a phenomenon that metal atoms migrate due to stress. Thus, these migrations are less likely to occur in the high melting point metal with a strong metallic bonding. Thus, when the high melting point metal is used for the metal film 12, the migration is less likely to occur.

For example, aluminum has a melting point of 660° C., a density of 2.7 g/cm³, Young's modulus of 68 GPa, and an acoustic impedance of 8.3 GPa·s/m. Molybdenum, which is a high melting point metal, has a melting point of 2622° C., a density of 10.2 g/cm³, Young's modulus of 329 GPa, and an acoustic impedance of 35.9 GPa·s/m. As seen above, molybdenum has a melting point 2000° C. higher than the melting point of aluminum, has a density approximately 4 times the density of aluminum, has Young's modulus approximately 5 times Young's modulus of aluminum, and has an acoustic impedance approximately 4 times the acoustic impedance of aluminum.

For example, the melting points of iridium, molybdenum, rhenium, rhodium, ruthenium, and tungsten are equal to or greater than the melting point of platinum (1774° C.). The densities are equal to or greater than 4 times the density of Al.

As described above, the high melting point metal having a melting point equal to or greater than the melting point of platinum has a high density and a high acoustic impedance. Accordingly, when these metals are used for the metal film 12, the acoustic velocity of the surface acoustic wave is reduced, and the loss is thereby reduced. In addition, size reduction becomes possible. Furthermore, since the melting point is high, the migration becomes less likely to occur.

However, when the high melting point metal having a melting point equal to or greater than the melting point of platinum is formed as the electrode finger 14 on the piezoelectric substrate 10, crystal grains are likely to have a columnar structure regardless of which of vacuum evaporation or sputtering is used. Thus, the insulating film 26 is preferably provided.

Second Variation of the Second Embodiment

Figure 11A:
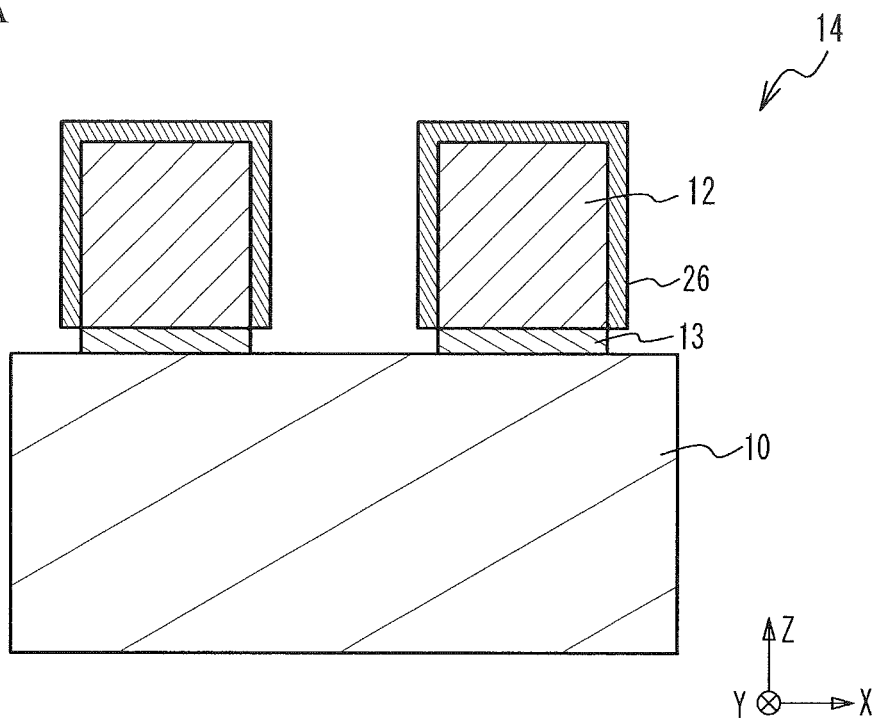
FIG. 11A and FIG. 11B are enlarged cross-sectional views of acoustic wave resonators in accordance with second and third variations of the second embodiment, respectively.

FIG. 11A is an enlarged cross-sectional view of an acoustic wave resonator in accordance with a second variation of the second embodiment. As illustrated in FIG. 11A, a metal film 13 is located between the piezoelectric substrate 10 and the metal film 12. The metal film 13 is a metal film mainly composed of, for example, titanium, chrome, and/or nickel. The metal film 13 functions as an adhesion film or a barrier film. Other structures are the same as those of the second embodiment, and the description thereof is thus omitted.

In the second variation of the second embodiment, the insulating film 26 is not located on the side surface of the metal film 13. However, an insulating film mainly composed of an oxide of the metal element that is the main component of the metal film 13 may be located on the side surface of the metal film 13.

Third Variation of the Second Embodiment

Figure 11B:
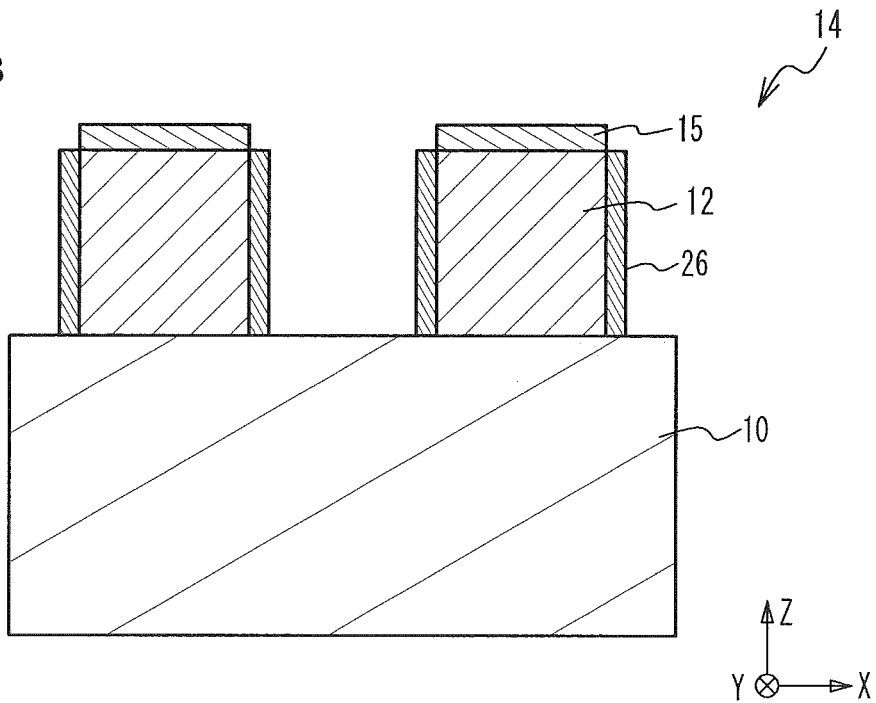

FIG. 11B is an enlarged cross-sectional view of an acoustic wave resonator in accordance with a third variation of the second embodiment. As illustrated in FIG. 11B, the electrode finger 14 may include a metal film 15 on the metal film 12. The metal film 15 functions as, for example, an adhesion layer or a barrier layer, and is mainly composed of titanium, chrome, and/or nickel. The metal film 15 may function as a low-resistance film having a lower resistivity than the metal film 12, and may be mainly composed of, gold, copper, or aluminum. Other structures are the same as those of the second embodiment, and the description thereof is thus omitted.

In the third variation of the second embodiment, the insulating film 26 is not located on the side surfaces nor the upper surface of the metal film 15. However, an insulating film mainly composed of an oxide of the metal element that is the main component of the metal film 15 may be located on the side surfaces and the upper surface of the metal film 15.

In the first and second embodiments and the variations thereof, the electrode finger 14 may include a plurality of metal films that are stacked as in the second and third variations of the second embodiment. The insulating film 26 is preferably located on the side surfaces of the thickest metal film among the metal films. The metal film 12 mainly functions as the electrode finger 14. Thus, the thicknesses of the metal films 13 and 15 are preferably equal to or less than the thickness of the metal film 12, more preferably equal to or less than one-half (½) of the thickness of the metal film 12, further preferably equal to or less than one-tenth (1/10) of the thickness of the metal film 12.

Third Embodiment

Figure 12A:
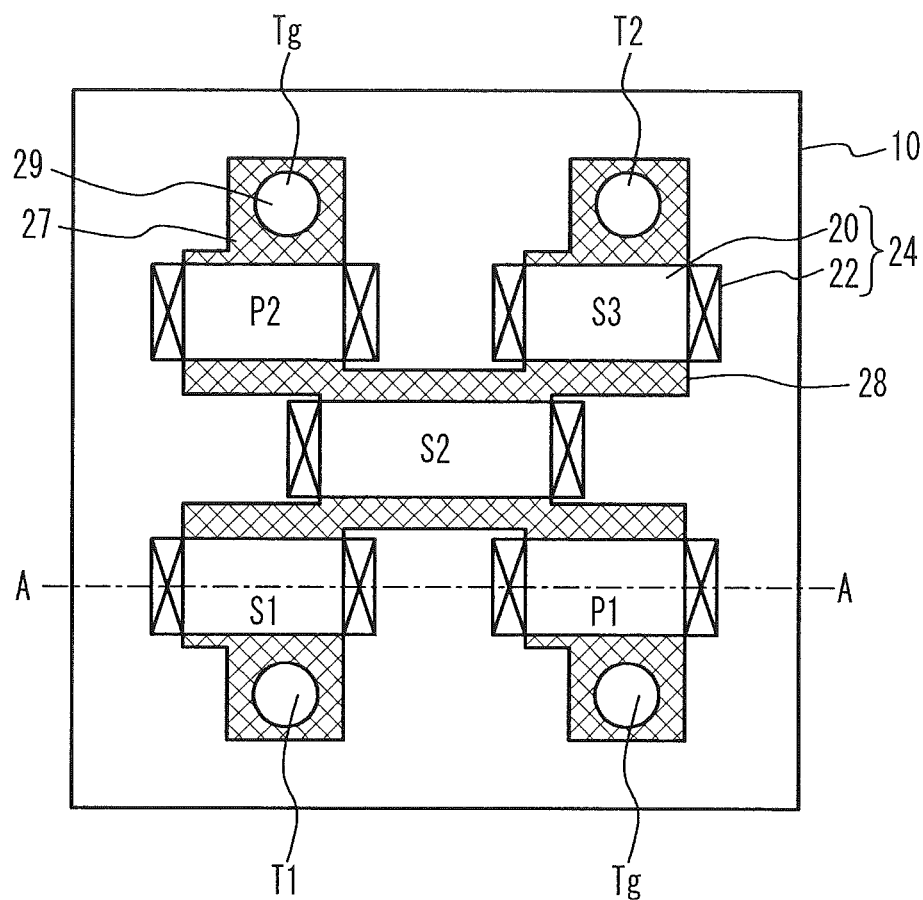
FIG. 12A is a plan view of a filter in accordance with a third embodiment.

A third embodiment is an exemplary filter including the acoustic wave resonator according to any one of the first and second embodiments and the variations thereof. FIG. 12A is a plan view of a filter in accordance with the third embodiment. As illustrated in FIG. 12A, the acoustic wave resonators 24, wiring lines 28, and pads 27 are located on the piezoelectric substrate 10. Bumps 29 are located on the pads 27. The acoustic wave resonator 24 includes the IDT 20 and the reflectors 22.

The acoustic wave resonators 24 include series resonators S1 through S3 and parallel resonators P1 and P2. The bumps 29 include terminals T1, T2, and Tg. The terminal T1 corresponds to an input terminal to which high-frequency signals are input. The terminal T2 corresponds to an output terminal from which high-frequency signals are output. The terminal Tg corresponds to a ground terminal to which a ground potential is supplied. The series resonators S1 through S3 are connected in series between the terminals T1 and T2, and the parallel resonators P1 and P2 are connected in parallel between the terminals T1 and T2.

As in the third embodiment, the acoustic wave resonator 24 according to any one of the first and second embodiments and the variations thereof can be used as at least one of resonators of the filter. The number of series resonators and the number of parallel resonators of the ladder-type filter can be selected as desired. The acoustic wave resonators of the first and second embodiments and the variations thereof may be used in the multimode filter.

Figure 12B:
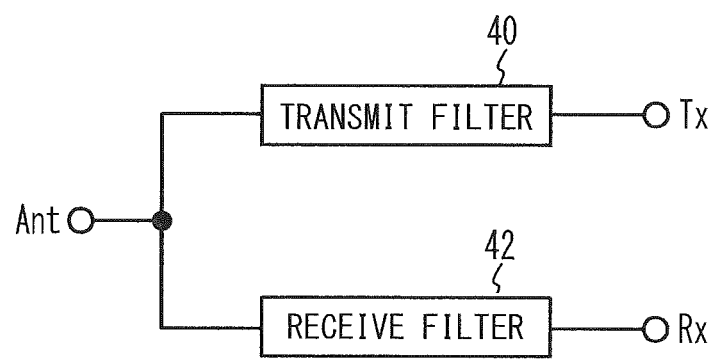
FIG. 12B is a circuit diagram of a duplexer in accordance with a first variation of the third embodiment.

FIG. 12B is a circuit diagram of a duplexer in accordance with a first variation of the third embodiment. As illustrated in FIG. 12B, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant among high-frequency signals input from the transmit terminal Tx, and suppresses other signals. The receive filter 42 allows signals in the receive band to pass therethrough among high-frequency signals input to the common terminal Ant, and suppresses other signals.

The filter of the second embodiment may be used for at least one of the transmit filter 40 and the receive filter 42. A duplexer is described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave device comprising:
a piezoelectric substrate; and
a pair of comb-shaped electrodes located on the piezoelectric substrate, each of the comb-shaped electrodes including a plurality of electrode fingers, side surfaces facing each other of the electrode fingers having a plurality of protrusion portions and a plurality of recessed portions arranged in an extension direction of the electrode fingers, ends of the protrusion portions and the recessed portions narrowing,
wherein
a sum of an interval of protrusion portions located adjacent to each other at a smallest interval among the protrusion portions and an interval of protrusion portions located adjacent to each other at a largest interval among the protrusion portions is equal to or less than 1/16 of a pitch of the electrode fingers of one of the pair of comb-shaped electrodes and is equal to or greater than 1/1000 of the pitch.

2. The acoustic wave device according to claim 1, wherein a sum of a distance in an arrangement direction of the electrode fingers between a top of a first protrusion portion and a bottom of a first recessed portion and a distance in the arrangement direction between a top of a second protrusion portion and a bottom of a second recessed portion is equal to or less than 1/16 of the pitch and is equal to or greater than 1/1000 of the pitch, the first protrusion portion and the first recessed portion being located next to each other, the distance in the arrangement direction between the top of the first protrusion portion and the bottom of the first recessed portion being smallest among distances in the arrangement direction between protrusion portions and recessed portions located next to each other of the protrusion portions and the recessed portions, the second protrusion portion and the second recessed portion being located next to each other, the distance in the arrangement direction between the top of the second protrusion portion and the bottom of the second recessed portion is largest among distances in the arrangement direction between the protrusion portions and the recessed portions located next to each other.

3. The acoustic wave device according to claim 1, wherein the protrusion portions and the recessed portions are located irregularly in the extension direction.

4. The acoustic wave device according to claim 1, further comprising:
an insulating film provided so as to cover the side surfaces and mainly composed of an oxide of a metal element that is a main component of the electrode fingers.

5. The acoustic wave device according to claim 4, wherein a metal film that the electrode fingers are mainly formed of includes crystal grains having columnar shapes, and a thickness of the insulating film is equal to or less than 1 time and equal to or greater than 1/8 of a sum of a width of a crystal grain having a largest width in an arrangement direction of the electrode fingers among the crystal grains and a width of a crystal grain having a smallest width in the arrangement direction among the crystal grains.

6. A filter comprising:
the acoustic wave device according to claim 1.

7. A multiplexer comprising:
the filter according to claim 6.

8. An acoustic wave device comprising:
a piezoelectric substrate; and
a pair of comb-shaped electrodes located on the piezoelectric substrate, each of the comb-shaped electrodes including a plurality of electrode fingers, side surfaces facing each other of the electrode fingers having a plurality of protrusion portions and a plurality of recessed portions arranged in an extension direction of the electrode fingers, ends of the protrusion portions and the recessed portions narrowing,
wherein
each of the pair of comb-shaped electrodes includes a bus bar to which the electrode fingers are connected, side surfaces of ends of the electrode fingers and a side surface, facing the ends, of the bus bar have protrusion portions and recessed portions arranged in an arrangement direction of the electrode fingers.

9. The acoustic wave device according to claim 8, wherein a sum of an interval of protrusion portions located adjacent to each other at a smallest interval among the protrusion portions and an interval of protrusion portions located adjacent to each other at a largest interval among the protrusion portions is equal to or less than $1/16$ of a pitch of the electrode fingers of one of the pair of comb-shaped electrodes and is equal to or greater than $1/1000$ of the pitch.

10. The acoustic wave device according to claim 8, wherein
the protrusion portions and the recessed portions are located irregularly in the extension direction.

11. The acoustic wave device according to claim 8, further comprising:
an insulating film provided so as to cover the side surfaces and mainly composed of an oxide of a metal element that is a main component of the electrode fingers.

12. A filter comprising:
the acoustic wave device according to claim 8.

13. A multiplexer comprising:
the filter according to claim 12.

14. An acoustic wave device comprising:
a piezoelectric substrate;
a pair of comb-shaped electrodes located on the piezoelectric substrate, each of the comb-shaped electrodes including a plurality of electrode fingers, side surfaces facing each other of the electrode fingers having a plurality of protrusion portions and a plurality of recessed portions arranged in an extension direction of the electrode fingers, ends of the protrusion portions and the recessed portions narrowing, and
an insulating film provided so as to cover the side surfaces and mainly composed of an oxide of a metal element that is a main component of the electrode fingers, wherein
a thickness of the insulating film is equal to or less than 1 time and equal to or greater than $1/100$ of a sum of a distance in an arrangement direction of the electrode fingers between a top of a first protrusion portion and a bottom of a first recessed portion and a distance in the arrangement direction between a top of a second protrusion portion and a bottom of a second recessed portion, the first protrusion portion and the first recessed portion being located next to each other, the distance in the arrangement direction between the top of the first protrusion portion and the bottom of the first recessed portion being smallest among distances in the arrangement direction between protrusion portions and recessed portions located next to each other of the protrusion portions and the recessed portions, the second protrusion portion and the second recessed portion being located next to each other, the distance in the arrangement direction between the top of the second protrusion portion and the bottom of the second recessed portion is largest among distances in the arrangement direction between the protrusion portions and the recessed portions located next to each other.

15. The acoustic wave device according to claim 14, wherein
the protrusion portions and the recessed portions are located irregularly in the extension direction.

16. A filter comprising:
the acoustic wave device according to claim 14.

17. A multiplexer comprising:
the filter according to claim 16.

* * * * *